United States Patent
Unno et al.

(10) Patent No.: US 12,423,875 B2
(45) Date of Patent: Sep. 23, 2025

(54) POINT-CLOUD DECODING DEVICE, POINT-CLOUD DECODING METHOD, AND PROGRAM

(71) Applicant: KDDI CORPORATION, Tokyo (JP)

(72) Inventors: Kyohei Unno, Fujimino (JP); Kei Kawamura, Fujimino (JP)

(73) Assignee: KDDI CORPORATION, Tokyo (JP)

( * ) Notice: Subject to any disclaimer, the term of this patent is extended or adjusted under 35 U.S.C. 154(b) by 400 days.

(21) Appl. No.: 18/069,054

(22) Filed: Dec. 20, 2022

(65) Prior Publication Data

US 2023/0133644 A1 May 4, 2023

Related U.S. Application Data

(63) Continuation of application No. PCT/JP2021/022811, filed on Jun. 16, 2021.

(30) Foreign Application Priority Data

Sep. 9, 2020 (JP) .................................. 2020-151393

(51) Int. Cl.
  *G06T 9/00* (2006.01)
  *G06T 9/40* (2006.01)
(52) U.S. Cl.
  CPC ................ *G06T 9/001* (2013.01); *G06T 9/40* (2013.01)
(58) Field of Classification Search
  None
  See application file for complete search history.

(56) References Cited

U.S. PATENT DOCUMENTS

| 11,057,645 B2* | 7/2021 | Hur .................... H04N 19/132 |
| 11,393,132 B2 | 7/2022 | Faramarzi et al. |
| 11,395,004 B2 | 7/2022 | Hur et al. |
| 11,544,877 B2 | 1/2023 | Oh |
| 11,580,672 B2* | 2/2023 | Van der Auwera .... H04N 19/13 |

(Continued)

FOREIGN PATENT DOCUMENTS

| WO | 2019/069711 A1 | 4/2019 |
| WO | 2020066680 A1 | 4/2020 |
| WO | 2021/010200 A1 | 1/2021 |

OTHER PUBLICATIONS

Notice of Reasons for Refusal with English translation dated Feb. 13, 2024, from corresponding Japanese Application No. 2020-104957.

(Continued)

*Primary Examiner* — Anand P Bhatnagar
(74) *Attorney, Agent, or Firm* — Troutman Pepper Locke LLP

(57) ABSTRACT

A point-cloud decoding device according to the present invention includes: a tree synthesizing unit configured to generate Mask_planar corresponding to eight child nodes of a node, wherein in a case where the node is subjected to quadtree division or binary tree division, the tree synthesizing unit (2020) is configured to set, as "0", a value of the Mask_planar corresponding to a child node belonging to a plane closer to an origin in an axial direction in which no division is made, and set, as "1", a value of the Mask_planar corresponding to a child node belonging to a plane further away from the origin in the axial direction in which no division is made.

7 Claims, 11 Drawing Sheets

(56) References Cited

U.S. PATENT DOCUMENTS

| | | | |
|---|---|---|---|
| 11,869,220 B2* | 1/2024 | Ramasubramonian | ........................ G06T 9/005 |
| 11,871,037 B2* | 1/2024 | Ramasubramonian | ........................ H04N 19/597 |
| 11,889,113 B2 | 1/2024 | Hur et al. | |
| 11,902,588 B2 | 2/2024 | Zhang et al. | |
| 11,902,589 B2 | 2/2024 | Zhang et al. | |
| 11,941,855 B2* | 3/2024 | Ray | ........................ H04N 19/597 |
| 12,118,758 B2* | 10/2024 | Van der Auwera | ..... G06T 9/001 |
| 12,217,354 B2 | 2/2025 | Huang | |
| 12,236,651 B2 | 2/2025 | Taquet et al. | |
| 12,238,341 B2 | 2/2025 | Zhang et al. | |
| 2020/0021844 A1 | 1/2020 | Yea et al. | |
| 2020/0105025 A1 | 4/2020 | Yea et al. | |
| 2020/0273211 A1* | 8/2020 | Kato | ........................ G06T 19/00 |
| 2021/0327099 A1* | 10/2021 | Van der Auwera | .. H04N 19/597 |
| 2021/0407143 A1* | 12/2021 | Van der Auwera | .... H04N 19/13 |
| 2021/0409778 A1* | 12/2021 | Ramasubramonian | ........................ H04N 19/70 |
| 2022/0038751 A1 | 2/2022 | Yano et al. | |
| 2022/0124374 A1 | 4/2022 | Zhang et al. | |
| 2022/0262043 A1 | 8/2022 | Nakagami et al. | |
| 2022/0286677 A1 | 9/2022 | Yang et al. | |
| 2022/0329858 A1* | 10/2022 | Zhang | ........................ H04N 19/96 |
| 2023/0047499 A1 | 2/2023 | Zhang et al. | |
| 2023/0058703 A1 | 2/2023 | Zhang et al. | |
| 2024/0121436 A1* | 4/2024 | Hur | ........................ H04N 19/167 |
| 2024/0171779 A1 | 5/2024 | Zhang et al. | |
| 2024/0303869 A1* | 9/2024 | Van der Auwera | .... H04N 19/70 |

OTHER PUBLICATIONS

Khaled Mammou et al., "Coding of Moving Pictures and Audio", International Organisation for Standardisation Organisation Internationale De Normalisation, ISO/IEC JTC1/SC29,WG11 N18189, G-PCC codec description v2, Jan. 2019, pp. 1-3, 26-33.

Diogo C. Garcia et al., "Context-Based Octree Coding for Point-Could Video", 2017 IEEE International Conference on Image Processing (ICIP), IEEE, Sep. 20, 2017, pp. 1412-14-16.

Information technology-MPEG-I (Coded Representation of Immersive Media); Part 9: Geometry-based Point Cloud Compression; ISO/IEC 23090-9: 2020 (E); ISO/IEC JTC 1/SC 29/WG 11 N19088.

Gao et al., "[G-PCC][New proposal] Predictive Geometry Coding", International Organisation for Standardisation Organiusation International De Normalisation, ISO/IEC JTC1/SC29/WG11, Coding of Moving Pictures and Audio, ISO/IEC JTC1/SC29/WG11 MPEG2019/m51012; Oct. 2019, Genva, CH.

Zhang et al. "Implicit Geometry Partition for Point Cloud Compression"; Mar. 24, 2020; pp. 73-82.

* cited by examiner

FIG. 4

| geometry_parameter_set( ) { | Descriptor |
|---|---|
|    gps_geom_parameter_set_id | ue(v) |
|    ... | |
|    gps_predictive_mode_enabled_flag | u(1) |
| if (!gps_predictive_mode_enabled_flag) { | |
|    geometry_planar_mode_flag | u(1) |
|    gps_implicit_geom_partition_flag | u(1) |
|    } | |
|    ... | |
| } | | position: a b c d e f g h
Mask_planar: 1 1 1 1 0 0 0 0 position: a b c d e f g h
Mask_planar: 1 0 0 0 1 0 0 0

FIG. 10

| attribute_parameter_set( ) { | Descriptor |
|---|---|
|    aps_attr_parameter_set_id | ue(v) |
|    aps_seq_parameter_set_id | ue(v) |
|    attr_coding_type | ue(v) |
|    ... | |
|    if ( attr_coding_type == 2 ) | |
|      lifting_scalability_enabled_flag | u(1) |
|      if ( ! lifting_scalability_enabled_flag ) { | |
|        lifting_num_detail_levels_minus1 | ue(v) |
|        if ( lifting_num_detail_levels_minus1 > 0 ) { | |
|          ... | |
|        } | |
|      else | |
|        lifting_morton_sort_skip_enabled_flag | u(1) |
|      } | |
|    ... | |
|    byte_alignment( ) | |
| } | |

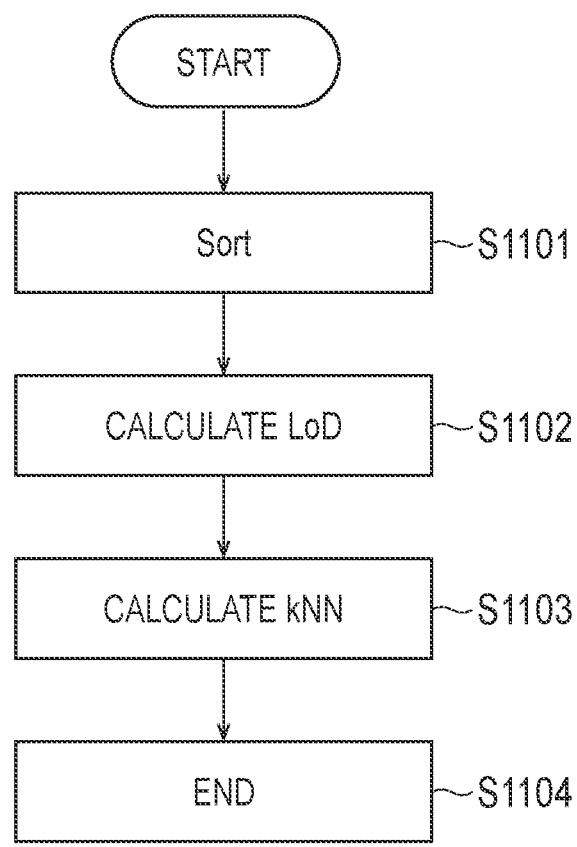

POINT-CLOUD DECODING DEVICE, POINT-CLOUD DECODING METHOD, AND PROGRAM

CROSS-REFERENCE TO RELATED APPLICATIONS

The present application is a continuation based on PCT Application No. PCT/JP2021/022811, filed on Jun. 16, 2021, which claims the benefit of Japanese patent application No. 2020-151393, filed on Sep. 9, 2020. The content of all of which are incorporated by reference herein in their entirety.

TECHNICAL FIELD

The present invention relates to a point-cloud decoding device, a point-cloud decoding method, and a program.

BACKGROUND

Non Patent Literature 1 discloses a technology in which position information of each point of point-cloud data is decoded and then each point of the point-cloud data is sorted based on the position information before decoding of attribute information of each point of the point-cloud data.

SUMMARY

However, according to the conventional technology, in order to sort each point of the point-cloud data based on the position information, decoding of the position information regarding the points of all point clouds requires completing, otherwise decoding of the attribute information is not allowed to start, leading to a disadvantage.

In addition, according to the conventional technology, if a process of sorting is omitted, no point-cloud processing order is defined in the decoding process of the attribute information, leading to a disadvantage.

Thus, the present invention has been made in consideration of the above disadvantages. An object of the present invention is to provide a point-cloud decoding device, a point-cloud decoding method, and a program that enable, even in a case where a process of sorting is not carried out before decoding of attribute information, unique association between the decoded positional information and attribute information, based on unique determination of a procedure for the decoding process of the attribute information.

A first aspect of the present invention is summarized as a point-cloud decoding device including: a tree synthesizing unit configured to generate Mask_planar corresponding to eight child nodes of a node, wherein in a case where the node is subjected to quadtree division or binary tree division, the tree synthesizing unit is configured to set, as "0", a value of the Mask_planar corresponding to a child node belonging to a plane closer to an origin in an axial direction in which no division is made, and set, as "1", a value of the Mask_planar corresponding to a child node belonging to a plane further away from the origin in the axial direction in which no division is made.

A second aspect of the present invention is summarized as a point-cloud decoding device including: a tree synthesizing unit configured to generate, for each axial direction of a node, a flag indicating whether or not Planar mode is applicable, wherein in a case where the node is subjected to quadtree division or binary tree division, the tree synthesizing unit is configured to set a value of the flag indicating whether or not the Planar mode is applicable, corresponding to an axial direction in which no division occurs, as a value indicating that the Planar mode is not applicable.

A third aspect of the present invention is summarized as a point-cloud decoding method including: generating Mask_planar corresponding to eight child nodes of a node, wherein in a case where the node is subjected to quadtree division or binary tree division, the generating incudes: setting, as "0", a value of the Mask_planar corresponding to a child node belonging to a plane closer to an origin in an axial direction in which no division is made; and setting, as "1", a value of the Mask_planar corresponding to a child node belonging to a plane further away from the origin in the axial direction in which no division is made.

A fourth aspect of the present invention is summarized as a point-cloud decoding method including: generating, for each axial direction of a node, a flag indicating whether or not Planar mode is applicable, in which in a case where the node is subjected to quadtree division or binary tree division, the generating includes setting a value of the flag indicating whether or not the Planar mode is applicable, corresponding to an axial direction in which no division occurs, as a value indicating that the Planar mode is not applicable.

A fifth aspect of the present invention is summarized as a program for use in a point-cloud decoding device, the program causing a computer to carry out: generating Mask_planar corresponding to eight child nodes of a node, wherein in a case where the node is subjected to quadtree division or binary tree division, the generating incudes: setting, as "0", a value of the Mask_planar corresponding to a child node belonging to a plane closer to an origin in an axial direction in which no division is made; and setting, as "1", a value of the Mask_planar corresponding to a child node belonging to a plane further away from the origin in the axial direction in which no division is made.

A sixth aspect of the present invention is summarized as a program for use in a point-cloud decoding device, the program causing a computer to carry out: generating, for each axial direction of a node, a flag indicating whether or not Planar mode is applicable, in which in a case where the node is subjected to quadtree division or binary tree division, the generating includes setting a value of the flag indicating whether or not the Planar mode is applicable, corresponding to an axial direction in which no division occurs, as a value indicating that the Planar mode is not applicable.

According to the present invention, it is possible to provide a point-cloud decoding device, a point-cloud decoding method, and a program that enable, even in a case where a process of sorting is not carried out before decoding of attribute information, unique association between the decoded positional information and attribute information, based on unique determination of a procedure for the decoding process of the attribute information.

BRIEF DESCRIPTION OF DRAWINGS

FIG. 4 is an example of a syntax configuration of GPS 2011 according to the embodiment.

FIG. 10 is an example of a syntax configuration of APS 2061 according to the embodiment.

FIG. 11 is a flow chart describing an example of a processing procedure of a LoD calculation unit 2090 of the point-cloud decoding device 200 according to the embodiment.

DETAILED DESCRIPTION

An embodiment of the present invention will be explained hereinbelow with reference to the drawings. Note that the constituent elements of the embodiment below can, where appropriate, be substituted with existing constituent elements and the like, and that a wide range of variations, including combinations with other existing constituent elements, is possible. Therefore, there are no limitations placed on the content of the invention as in the claims on the basis of the disclosures of the embodiment hereinbelow.

First Embodiment

Figure 1:
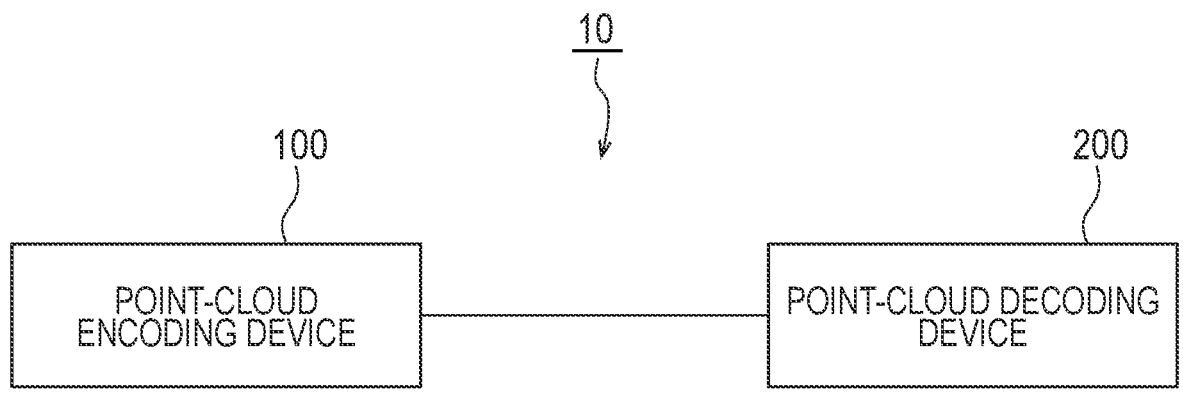
FIG. 1 is a diagram illustrating an example of a configuration of a point-cloud processing system 10 according to an embodiment.

Hereinafter, with reference to FIG. 1 to FIG. 8C, a point-cloud processing system 10 according to a first embodiment of the present invention will be described. FIG. 1 is a diagram illustrating the point-cloud processing system 10 according to an embodiment according to the present embodiment.

As illustrated in FIG. 1, the point-cloud processing system 10 has a point-cloud encoding device 100 and a point-cloud decoding device 200.

The point-cloud encoding device 100 is configured to generate encoded data (bit stream) by encoding input point-cloud signals. The point-cloud decoding device 200 is configured to generate output point-cloud signals by decoding the bit stream.

Note that the input point-cloud signals and the output point-cloud signals include position information and attribute information of points in point clouds. The attribute information is, for example, color information or a reflection ratio of each point.

Herein, the bit stream may be transmitted from the point-cloud encoding device 100 to the point-cloud decoding device 200 via a transmission path. The bit stream may be stored in a storage medium and then provided from the point-cloud encoding device 100 to the point-cloud decoding device 200.

(Point-Cloud Decoding Device 200)

Figure 2:
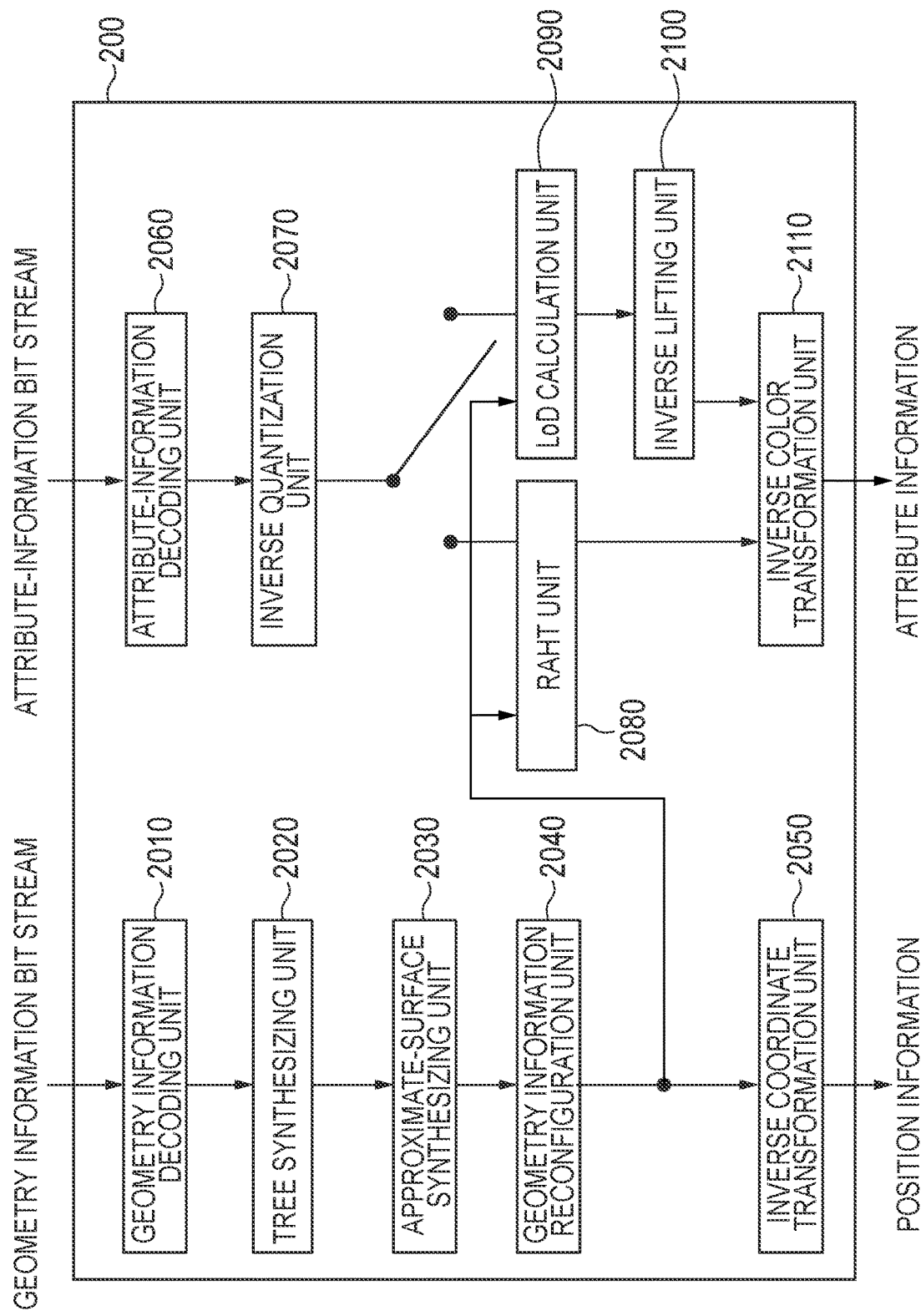
FIG. 2 is a diagram illustrating an example of functional blocks of a point-cloud decoding device 200 according to the embodiment.

Hereinafter, with reference to FIG. 2, the point-cloud decoding device 200 according to the present embodiment will be described. FIG. 2 is a diagram illustrating an example of functional blocks of the point-cloud decoding device 200 according to the present embodiment.

As illustrated in FIG. 2, the point-cloud decoding device 200 has a geometry information decoding unit 2010, a tree synthesizing unit 2020, an approximate-surface synthesizing unit 2030, a geometry information reconfiguration unit 2040, an inverse coordinate transformation unit 2050, an attribute-information decoding unit 2060, an inverse quantization unit 2070, a RAHT unit 2080, a LoD calculation unit 2090, an inverse lifting unit 2100, and an inverse color transformation unit 2110.

The geometry information decoding unit 2010 is configured to use, as input, a bit stream about geometry information (geometry information bit stream) among bit streams output from the point-cloud encoding device 100 and to decode syntax.

A decoding process is, for example, a context-adaptive binary arithmetic decoding process. Herein, for example, the syntax includes control data (flags and parameters) for controlling the decoding process of the position information.

The tree synthesizing unit 2020 is configured to use, as input, control data, which has been decoded by the geometry information decoding unit 2010, and later-described occupancy code that shows on which nodes in a tree a point cloud is present and to generate tree information about in which regions in a decoding target space points are present.

The present process can generate the tree information by recursively repeating a process of sectioning the decoding target space by cuboids, determining whether the points are present in each cuboid by referencing the occupancy code, dividing the cuboid in which the points are present into plural cuboids, and referencing the occupancy code.

In the present embodiment, there can be used a method called "Octree" in which octree division is recursively carried out with the above described cuboids always as cubes and a method called "QtBt" in which quadtree division and binary tree division are carried out in addition to octree division. Whether or not "QtBt" is to be used is transmitted as the control data from the point-cloud encoding device 100 side.

Alternatively, in a case where the control data specifies that later-described Predictive coding is to be used, the tree synthesizing unit 2020 is configured to decode the coordinates of each point, based on a tree configuration determined in the point-cloud encoding device 100.

The approximate-surface synthesizing unit 2030 is configured to generate approximate-surface information by using the tree information generated by the tree-information synthesizing unit 2020.

In a case where point clouds are densely distributed on a surface of an object, for example, when three-dimensional point-cloud data of the object is to be decoded, the approximate-surface information approximates and expresses the region in which the point clouds are present by a small flat surface instead of decoding the individual point clouds.

Specifically, the approximate-surface synthesizing unit 2030 can generate the approximate-surface information, for example, by a method called "Trisoup". As specific processes of "Trisoup", for example, the methods described in Non Patent Literatures 1 and 2 can be used. When sparse point-cloud data acquired by Lidar or the like is to be decoded, the present process can be omitted.

The geometry information reconfiguration unit 2040 is configured to reconfigure the geometry information of each point of the decoding-target point cloud (position information in a coordinate system assumed by the decoding process) based on the tree information generated by the tree-information synthesizing unit 2020 and the approximate-surface information generated by the approximate-surface synthesizing unit 2030.

The inverse coordinate transformation unit 2050 is configured to use the geometry information, which has been reconfigured by the geometry information reconfiguration unit 2040, as input, to transform the coordinate system assumed by the decoding process to a coordinate system of the output point-cloud signals, and to output the position information.

The attribute-information decoding unit 2060 is configured to use, as input, a bit stream about the attribute information (attribute-information bit stream) among bit streams output from the point-cloud encoding device 100 and to decode syntax.

A decoding process is, for example, a context-adaptive binary arithmetic decoding process. Herein, for example, the syntax includes control data (flags and parameters) for controlling the decoding process of the attribute information.

The attribute-information decoding unit 2060 is configured to decode quantized residual information from the decoded syntax.

The inverse quantization unit 2070 is configured to carry out an inverse quantization process and generate inverse-quantized residual information based on quantized residual information decoded by the attribute-information decoding unit 2060 and a quantization parameter which is part of the control data decoded by the attribute-information decoding unit 2060.

The inverse-quantized residual information is output to either one of the RAHT unit 2080 and LoD calculation unit 2090 depending on characteristics of the point cloud serving as a decoding target. The control data decoded by the attribute-information decoding unit 2060 specifies to which one the information is to be output.

The RAHT unit 2080 is configured to use, as input, the inverse-quantized residual information generated by the inverse-quantized residual information and the geometry information generated by the geometry information reconfiguration unit 2040 and to decode the attribute information of each point by using one type of Haar transformation (in a decoding process, inverse Haar transformation) called Region Adaptive Hierarchical Transform (RAHT). As specific processes of RAHT, for example, the methods described in Non Patent Literatures 1 and 2 can be used.

The LoD calculation unit 2090 is configured to use the geometry information, which has been generated by the geometry information reconfiguration unit 2040, as input and to generate Level of Detail (LoD).

LoD is the information for defining a reference relation (referencing point and point to be referenced) for realizing prediction encoding which predicts, from the attribute information of a certain point, the attribute information of another point and encodes or decodes prediction residual.

In other words, LoD is the information defining a hierarchical structure which categorizes the points included in the geometry information into plural levels and encodes or decodes the attributes of the point belonging to a lower level by using the attribute information of the point which belongs to a higher level.

As specific methods of determining LoD, for example, the methods described in Non Patent Literatures 1 and 2 may be used. Other examples will be described later.

The inverse lifting unit 2100 is configured to decode the attribute information of each point based on the hierarchical structure defined by LoD by using the LoD generated by the LoD calculation unit 2090 and the inverse-quantized residual information generated by the inverse-quantized residual information. As specific processes of the inverse lifting, for example, the methods described in Non Patent Literatures 1 and 2 can be used.

The inverse color transformation unit 2110 is configured to subject the attribute information, which is output from the RAHT unit 2080 or the inverse lifting unit 2100, to an inverse color transformation process when the attribute information of the decoding target is color information and when color transformation has been carried out on the point-cloud encoding device 100 side. Whether to execute the inverse color transformation process or not is determined by the control data decoded by the attribute-information decoding unit 2060.

The point-cloud decoding device 200 is configured to decode and output the attribute information of each point in the point cloud by the above described processes.

(Geometry Information Decoding Unit 2010)

Hereinafter, the control data decoded by the geometry information decoding unit 2010 will be described by using FIG. 3 to FIG. 5.

Figure 3:
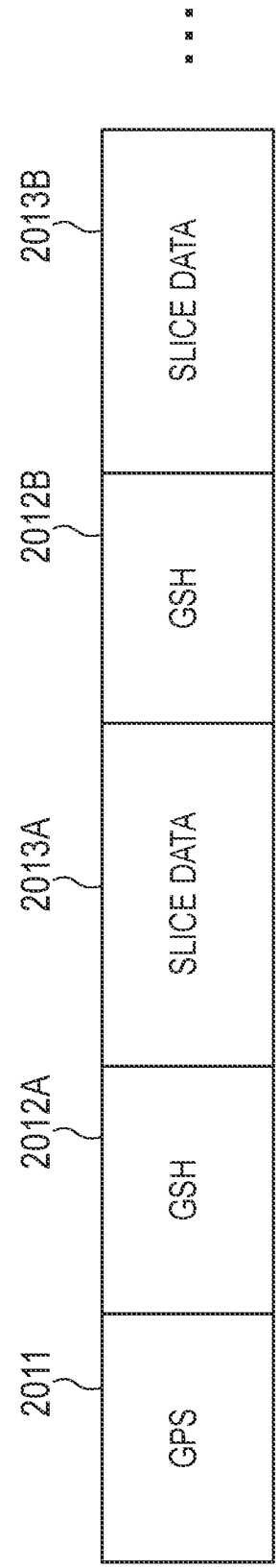
FIG. 3 is a configuration example of encoded data (bit stream) received by a geometry information decoding unit 2010 of the point-cloud decoding device 200 according to the embodiment.

FIG. 3 is a configuration example of the encoded data (bit stream) received by the geometry information decoding unit 2010.

First, the bit stream may include GPS 2011. The GPS 2011 is also called a geometry parameter set and is an aggregate of the control data about decoding of geometry information. A specific example will be described later. Each GPS 2011 includes at least GPS id information for individual identification in a case where plural pieces of GPS 2011 are present.

Secondly, the bit stream may include GSH 2012A/2012B. The GSH 2012A/2012B are also called geometry slice headers and are aggregates of the control data corresponding to later-described slices. In the following description, the term "slice" is used. The slice can be regarded as a data unit. A specific example will be described later. The GSH 2012A/2012B includes at least GPS id information for specifying the GPS 2011 corresponding to the GSH 2012A/2012B.

Thirdly, the bit stream may include slice data 2013A/2013B subsequent to the GSH 2012A/2012B. The slice data 2013A/2013B includes encoded data of geometry information. An example of the slice data 2013A/2013B is later-described occupancy code.

As described above, the bit stream is configured so that the respective GSH 2012A/2012B and the GPS 2011 correspond to each slice data 2013A/2013B.

As described above, since which GPS 2011 is to be referenced is specified by the GPS id information in the GSH 2012A/2012B, the common GPS 2011 can be used for the plural pieces of slice data 2013A/2013B.

In other words, the GPS 2011 is not always required to be transmitted for each slice. For example, the bit stream can be configured so that the GPS 2011 is not encoded immediately anterior to the GSH 2012B and the slice data 2013B like FIG. 3.

Note that the configuration of FIG. 3 is merely an example. As long as the GSH 2012A/2012B and the GPS 2011 are configured to correspond to each slice data 2013A/2013B, an element(s) other than those described above may be added as a constituent element(s) of the bit stream. For example, the bit stream may include a sequence parameter set (SPS). Similarly, for transmission, the bit stream may be formed into a configuration different from that of FIG. 3. Furthermore, the bit stream may be synthesized with the bit stream, which is decoded by the later-described attribute-information decoding unit 2060, and transmitted as a single bit stream.

FIG. 4 is an example of a syntax configuration of the GPS 2011.

Note that syntax names in the following description are just exemplary. The syntax names may each vary as long as the corresponding function of syntax described below is achieved.

The GPS 2011 may include GPS id information (gps_geom_parameter_set_id) for identifying each GPS 2011.

Note that the Descriptor section of FIG. 4 indicates how each piece of syntax is encoded. ue(v) represents an unsigned 0-exponent Golomb code, and u(1) represents a 1-bit flag.

The GPS 2011 may include a flag (gps_predictive_mode_enabled_flag) for control of whether or not the tree synthesizing unit 2020 uses Predictive coding.

For example, it may be defined that, when the value of gps_predictive_mode_enabled_flag is "1", Predictive coding is used, and it may be defined that, when the value of gps_predictive_mode_enabled_flag is "0", no Predictive coding is used.

The GPS 2011 may include a flag (geometry_planar_mode_flag) for control of whether or not the tree synthesizing unit 2020 uses Planar mode.

For example, it may be defined that, when the value of geometry_planar_mode_flag is "1", Planar mode is used, and it may be defined that, when the value of geometry_planar_mode_flag is "0", no Planar mode is used.

The GPS 2011 may include a flag (geom_tree_coded_axis_list_present_flag) for control of whether or not the tree synthesizing unit 2020 carries out "QtBt".

For example, it may be defined that, when the value of geom_tree_coded_axis_list_present_flag is "1", "QtBt" is carried out, and it may be defined that, when the value of geom_tree_coded_axis_list_present_flag is "0", only "Octree" is carried out.

Alternatively, it may be defined that, when the value of geom_tree_coded_axis_list_present_flag is "1", a cuboid is allowable as the node shape in addition to a cube (namely, "QtBt" is also used), and it may be defined that, when the value of geom_tree_coded_axis_list_present_flag is "0", only a cuboid is allowed as the node shape (namely, only "Octree" is carried out).

The above described definitions are not limiting, and control of whether or not "QtBt" is available is required to be defined.

Note that it may be defined that, only when no Predictive coding is used, geometry_planar_mode_flag and geom_tree_coded_axis_list_present_flag are decoded.

(Tree Synthesizing Unit 2020)

An example of a process of the tree synthesizing unit 2020 will be described with FIGS. 5 to 8. FIG. 5 is a flow chart illustrating an example of a process of the tree synthesizing unit 2020.

Figure 5:
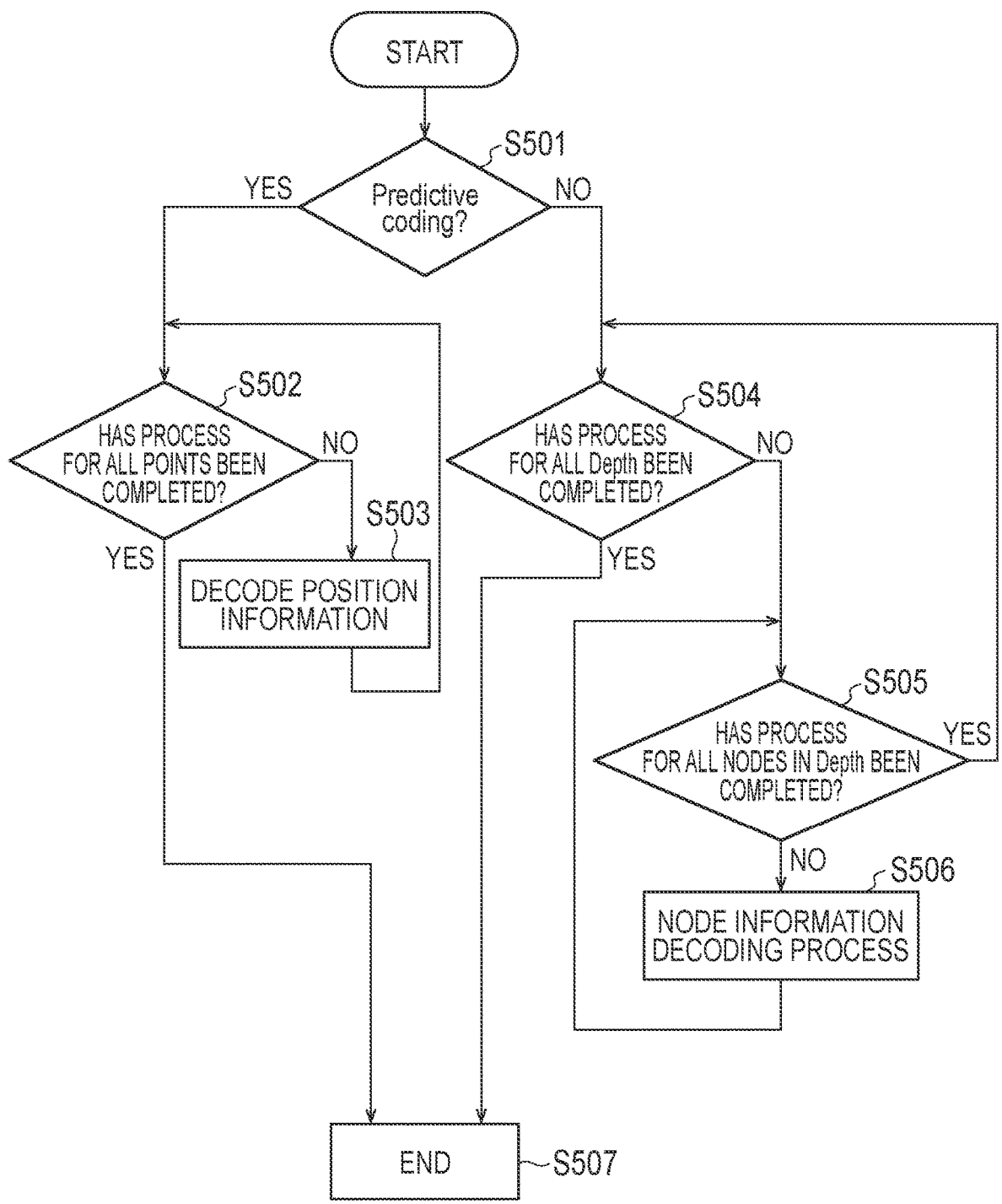
FIG. 5 is a flow chart illustrating an example of a process of a tree synthesizing unit 2020 of the point-cloud decoding device 200 according to the embodiment.

As illustrated in FIG. 5, in step S501, the tree synthesizing unit 2020 determines whether or not Predictive coding is to be applied.

For example, with reference to the value of gps_predictive_mode_enabled_flag, the tree synthesizing unit 2020 can determine whether or not Predictive coding is to be applied.

When determining that Predictive coding is to be applied, the tree synthesizing unit 2020 proceeds to the process in step S502. When determining that Predictive coding is not to be applied, the tree synthesizing unit 2020 proceeds to the process in step S504.

In step S502, the tree synthesizing unit 2020 determines whether or not decoding of position information of all point-cloud data included in an appropriate slice has been completed.

Regarding the process in step S502, for example, information indicating the number of pieces of point-cloud data included in the slice is transmitted in advance with GSH and then the number of pieces of point-cloud data and the number of pieces of data having already been processed are compared, so that whether or not a process for all the points have been completed can be determined.

In a case where decoding of the position information of all point-cloud data (position information of all points of the point cloud) has been completed, the tree synthesizing unit 2020 proceeds to the process in step S507, leading to processing termination. Meanwhile, in a case where decoding of the position information of all point-cloud data (position information of all points of the point cloud) has not been completed, the tree synthesizing unit 2020 proceeds to the process in step S503.

In step S503, the tree synthesizing unit 2020 decodes, with Predictive coding, the position information of one point in the point-cloud data (position information of one point in the point cloud).

Predictive coding is a means of decoding the difference between the position information predicted from decoded point-cloud data and the position information of the point-cloud data, adding both, and decoding the position information of the point-cloud data. A specific method can be achieved, for example, with a technique described in Non Patent Literature 2.

After decoding the position information of the one point in the point-cloud data in step S503, the tree synthesizing unit 2020 goes back to the process in step S502.

When determining that Predictive coding is to be applied, the tree synthesizing unit 2020 repeatedly carries out step S502 and step S503, so that the position information of all the point-cloud data can be decoded.

Here, the tree synthesizing unit 2020 may give, in ascending order in the order of decoding in step S503, an index to each point of the point-cloud data of which the position information has been decoded. Furthermore, the tree synthesizing unit 2020 may store, in order, the index in one-dimensional array data Order[i].

As above, the tree synthesizing unit 2020 may has Predictive coding as a means for a method of decoding the position information and may be configured to give, based on the order of decoding in Predictive coding, an index to each point of the point-cloud data and to store the index in a one-dimensional array.

Due to such a configuration, even in a case where a process of sorting is not carried out in the later-described LoD calculation unit 2090, a procedure for the decoding process of the attribute information is uniquely determined, leading to unique association between the decoded position information and attribute information.

Next, a process in a case where no Predictive coding is applied will be described.

In step S504, regarding a tree structure in a case where "Octree" or "QtBt" is applied, the tree synthesizing unit 2020 checks whether or not a process for all Depth has been completed.

The value of Depth of the slice can be transmitted, for example, with GSH in advance. By comparing the value of Depth of the slice and the value of Depth having already been processed, the tree synthesizing unit 2020 can determine whether or not a process for all Depth has been completed.

In a case where a process for all Depth has been completed, the tree synthesizing unit 2020 proceeds to the process in step S507, leading to processing termination. Meanwhile, in a case where a process for all Depth has not been completed, the tree synthesizing unit 2020 proceeds to the process in step S505.

In step S505, the tree synthesizing unit 2020 determines whether or not a process for all nodes in the Depth has been completed.

The number of nodes included in the Depth can be calculated from a result of the node information decoding process (step S506) based on Depth processed immediately before. The number of nodes included in Depth to be processed first is one.

In a case where a process for all the nodes included in the Depth have been completed, the tree synthesizing unit 2020 goes back to the process in step S504. Meanwhile, in a case where a process for all the nodes have not been completed, the tree synthesizing unit 2020 proceeds to the process in step S506.

In step S506, the tree synthesizing unit 2020 divides the node into eight child nodes in a case where "Octree" is used or divides the node into eight child nodes, four child nodes, or two child nodes in a case where "QtBt" is used. Based on information of Occupancy code or the like, the tree synthesizing unit 2020 decodes Occupancy map indicating whether or not the point-cloud data is included in each child node.

For example, when the value of Occupancy map is "1", it can be defined that the point-cloud data is present in the corresponding child node. For example, when the value of Occupancy map is "0", it can be defined that no point-cloud data is present in the corresponding child node or it can be defined that the child node itself is not present.

Therefore, the tree synthesizing unit 2020 counts the number of child nodes of which the value of Occupancy map is "1" in the same Depth, so that the number of nodes in Depth to be processed next can be acquired. An example of a specific process in step S506 will be described later.

When generation of Occupancy map is completed for one node, the tree synthesizing unit 2020 goes back to the process in step S505.

As above, in a case where no Predictive coding is applied, while repeating the processes in steps S504 to 506, the tree synthesizing unit 2020 carries out recursive node division such that a node size of 1×1×1 is obtained, so that the position information of the point-cloud data can be decoded.

Here, each point of the point-cloud data of which the position information is decoded may be given an index in ascending order in the order of decoding in step S506 and then the index may be stored in order in the one-dimensional array data Order[i].

As above, the tree synthesizing unit 2020 may decode the position information on each point of the point-cloud data as the decoding target and give an index to each point in ascending order in the order of decoding of the position information. Furthermore, the tree synthesizing unit 2020 may be configured to store the index in a one-dimensional array.

Due to such a configuration, even in a case where a process of sorting is not carried out in the later-described LoD calculation unit 2090, a procedure for the decoding process of the attribute information is uniquely determined, leading to unique association between the decoded position information and attribute information.

Figure 6:
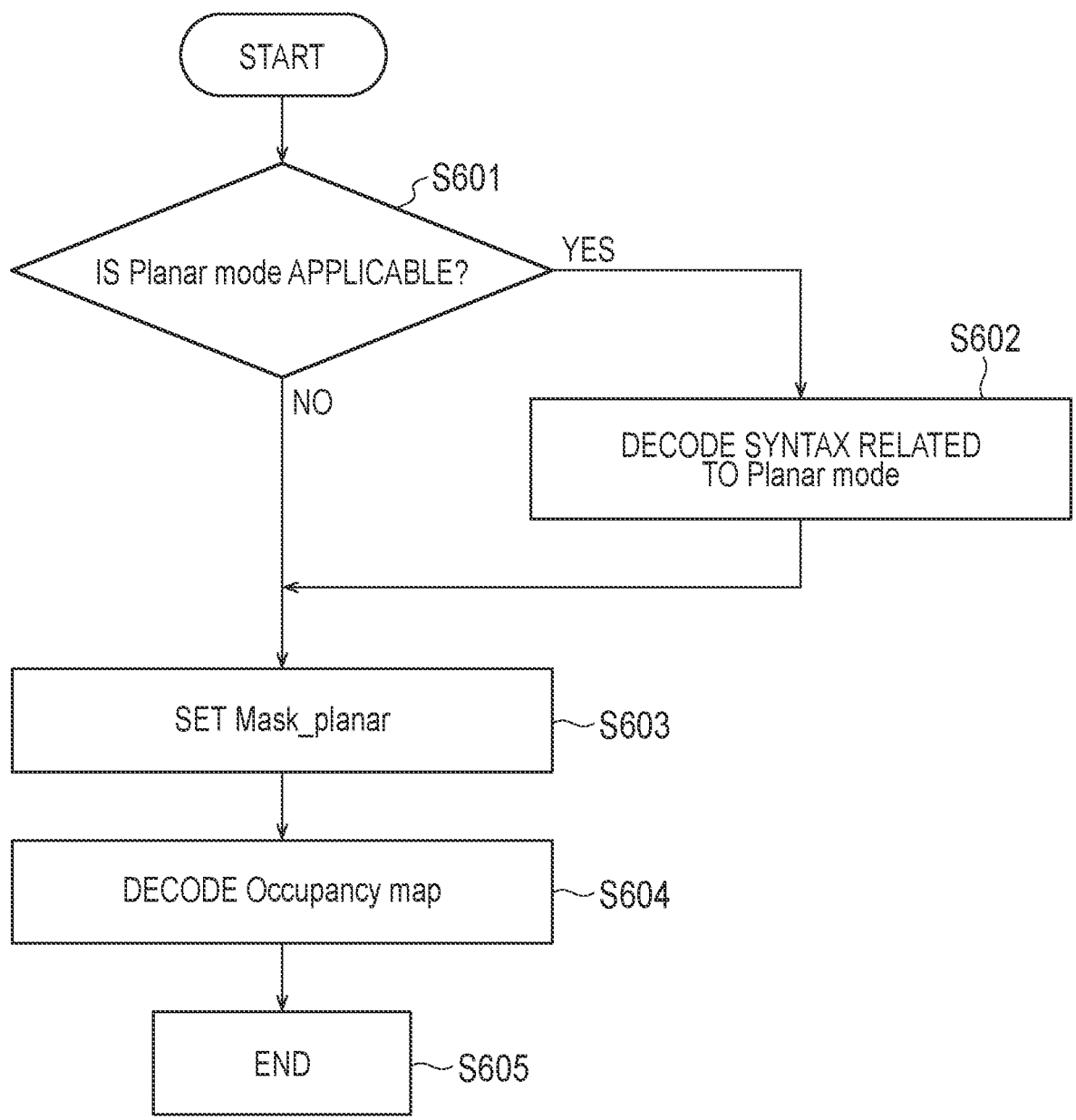
FIG. 6 is a flow chart illustrating an example of a node information decoding process in step S506 of FIG. 5.

FIG. 6 is a flow chart illustrating an example of a node information decoding process in step S506.

In step S601, the tree synthesizing unit 2020 determines whether or not Planar mode is applicable to each axial direction of the node (e.g., to each of the x axis, y axis, and z axis).

In a case where Planar mode is applicable, the tree synthesizing unit 2020 proceeds to the process in step S602. Meanwhile, in a case where Planar mode is not applicable, the tree synthesizing unit 2020 proceeds to the process in step S603.

For example, the tree synthesizing unit 2020 first derives eligible_planar_flag indicating whether or not Planar mode is applicable, for each axial direction and refers to the value of eligible_planar_flag, resulting in determination of whether or not Planar mode is applicable.

For example, it may be defined that, when the value of eligible_planar_flag is "1", Planar mode is applicable to the axial direction of the node, and it may be defined that, when the value of eligible_planar_flag is "0", Planar mode is not applicable to the axial direction of the node.

Here, in a case where no division is carried out in the axial direction of the node due to application of "QtBt", the value of eligible_planar_flag corresponding thereto may be set as "0", namely, Planar mode may be set as not applicable.

That is, a flag indicating whether or not Planar mode is applicable may be generated for each axial direction of the node. In a case where the node is subjected to quadtree division or binary tree division, the value of the flag indicating whether or not Planar mode is applicable, corresponding to the axial direction in which no division occurs, may be set as the value indicating that Planar mode is not applicable.

Here, whether or not division is to be carried out in the axial direction of the node can be determined with various methods. For example, as in Non Patent Literature 1, a tacit determination may be made based on the rule and node shape determined in advance, or an explicit determination may be transmitted from the point-cloud encoding device 100 side through a bit stream.

For example, with GSH, information indicating in which axial direction division is to be carried out at each Depth may be transmitted as 3-bit syntax (the bits correspond one-to-one to the axial directions). For example, it can be defined that the axis of which the value of the bit is "1" is to be divided and the axis of which the value of the bit is "0" is not to be divided.

Here, for example, in a case where, at Depth to which the node belongs, the bit corresponding to the axial direction indicates "0 (="no division")", the value of eligible_planar_flag corresponding thereto may be set as "0", namely, Planar mode may be set as not applicable.

In step S602, the tree synthesizing unit 2020 decodes syntax related to Planar mode. For example, the tree synthesizing unit 2020 decodes is_planar_flag and plane_position as described in Non Patent Literature 1. After decoding the syntax, the tree synthesizing unit 2020 proceeds to the process in step S603.

In step S603, the tree synthesizing unit 2020 sets Mask_planar.

Mask_planar is an 8-bit bitmask. In a case where the node is divided into two in triaxial directions (e.g., the x axis, y axis, and z axis), the bits correspond one-to-one to the child nodes. For example, when the value of a bit is "1", it can be defined that no corresponding child node is present or no point-cloud data is present in the corresponding child node. Similarly, when the value of a bit is "0", it can be defined that the point-cloud data is possibly present in the corresponding child node.

Here, regarding the axial direction in which no division has occurred due to "QtBt", the tree synthesizing unit 2020 may set Mask_planar such that the bit corresponding to a child node belonging to a plane (lower plane) of which the coordinates are closer to the origin (0) when viewed in the axial direction is "0" and the bit corresponding to a child node belonging to a plane (upper plane) of which the coordinates are further away from the origin is "1".

That is, the tree synthesizing unit 2020 may be configured to generate Mask_planar corresponding to eight child nodes of each node. In a case where the node is subjected to quadtree division or binary tree division, the tree synthesizing unit 2020 may be configured to set, as "0", the value of Mask_planar corresponding to a child node belonging to a plane closer to the origin in the axial direction in which no division is made and to set, as "1", the value of Mask_planar corresponding to a child node belonging to a plane further away from the origin in the axial direction in which no division is made.

Figure 8A:
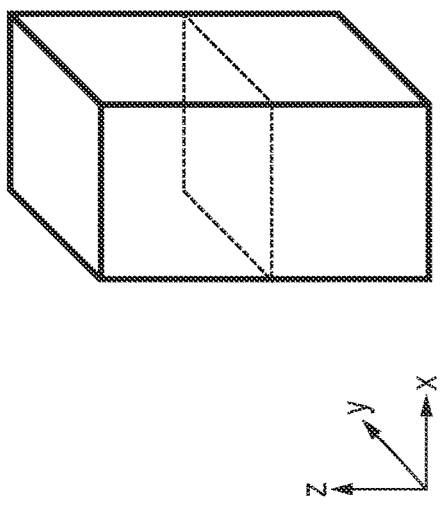
FIGS. 8A-8C are diagrams illustrating an example of a method of setting Mask_planar in step S601 of FIG. 6.
Figure 8B:
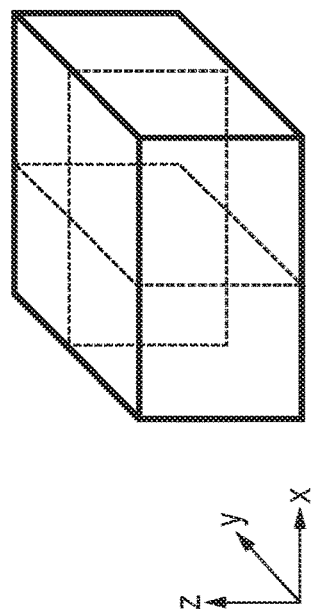
Figure 8C:
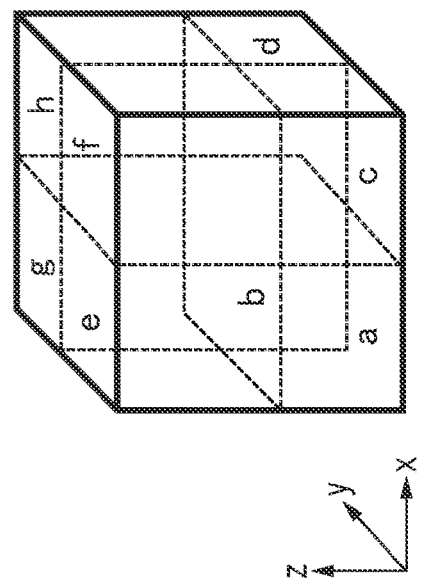

Specific examples according thereto are illustrated in FIGS. 8A-8C.

For example, as in FIG. 8A, in a case where quadtree division (Qt) is carried out such that the node is not divided in the z-axis direction, as illustrated in FIG. 8A, in Mask_planar, the bits corresponding to the lower plane in the z-axis direction are "0" and the bits corresponding to the upper plane in the z-axis direction are "1". Note that the labels a to h indicated as position in FIG. 8A correspond one-to-one to the positions of child nodes indicated in FIG. 8C.

Similarly, as in FIG. 8B, in a case where binary tree division (Bt) is carried out such that no division is carried out in both of the x-axis direction and the y-axis direction, only the bits corresponding to the child nodes belonging to the lower planes in both of the x-axis direction and the y-axis direction are "0" and the other bits are "1".

As above, after setting Mask_planar, the tree synthesizing unit 2020 proceeds to the process in step S604.

In step S604, the tree synthesizing unit 2020 decodes Occupancy map. Here, for decoding of Occupancy map, the above described Mask_planar and Occupancy code included in the bit stream transmitted from the point-cloud encoding device 100 are used.

Occupancy map is 8 bits, similarly to the above described Mask_planar. Similarly to Mask_planar, in a case where the node is divided into two in triaxial directions (e.g., the x axis, y axis, and z axis), the bits correspond one-to-one to the child nodes.

Here, regarding a child node of which the value of Mask_planar is "1", the tree synthesizing unit 2020 decodes the corresponding bit of Occupancy map as "0 (no point-cloud data is present in the child node)".

Meanwhile, regarding a child node of which the value of Mask_planar is "0", the tree synthesizing unit 2020 decodes Occupancy code. Then, the tree synthesizing unit 2020 sets, when the value of Occupancy code is "1 (point-cloud data is present in the child node)", the corresponding bit of Occupancy map as "1" and sets, when the value of Occupancy code is "0 (no point-cloud data is present in the child node)", the corresponding bit of Occupancy map as "0".

That is, the tree synthesizing unit 2020 may be configured to decode Occupancy map indicating whether or not the point-cloud data is present in each child node of the node, to set, regarding a child node of which the value of the above described Mask_planar is "1", the value of Occupancy map corresponding thereto as "0", and to set, regarding a child node of which the value of the above described Mask_planar is "0", the value of Occupancy map with reference to the value of Occupancy code included in the bit stream.

Due to such a configuration as above, control at the time of "QtBt" can be achieved with Mask_planar provided for Planar mode, leading to simplification of specifications and device design based thereon.

Note that the value of Mask_planar described above is exemplary, and thus the role of the bit with "0" and the role of the bit with "1" described above may be exchanged.

As above, the tree synthesizing unit 2020 can decode 8-bit Occupancy map corresponding to each node. After decoding Occupancy map, the tree synthesizing unit 2020 proceeds to the process in step S605, leading to processing termination.

Figure 7:
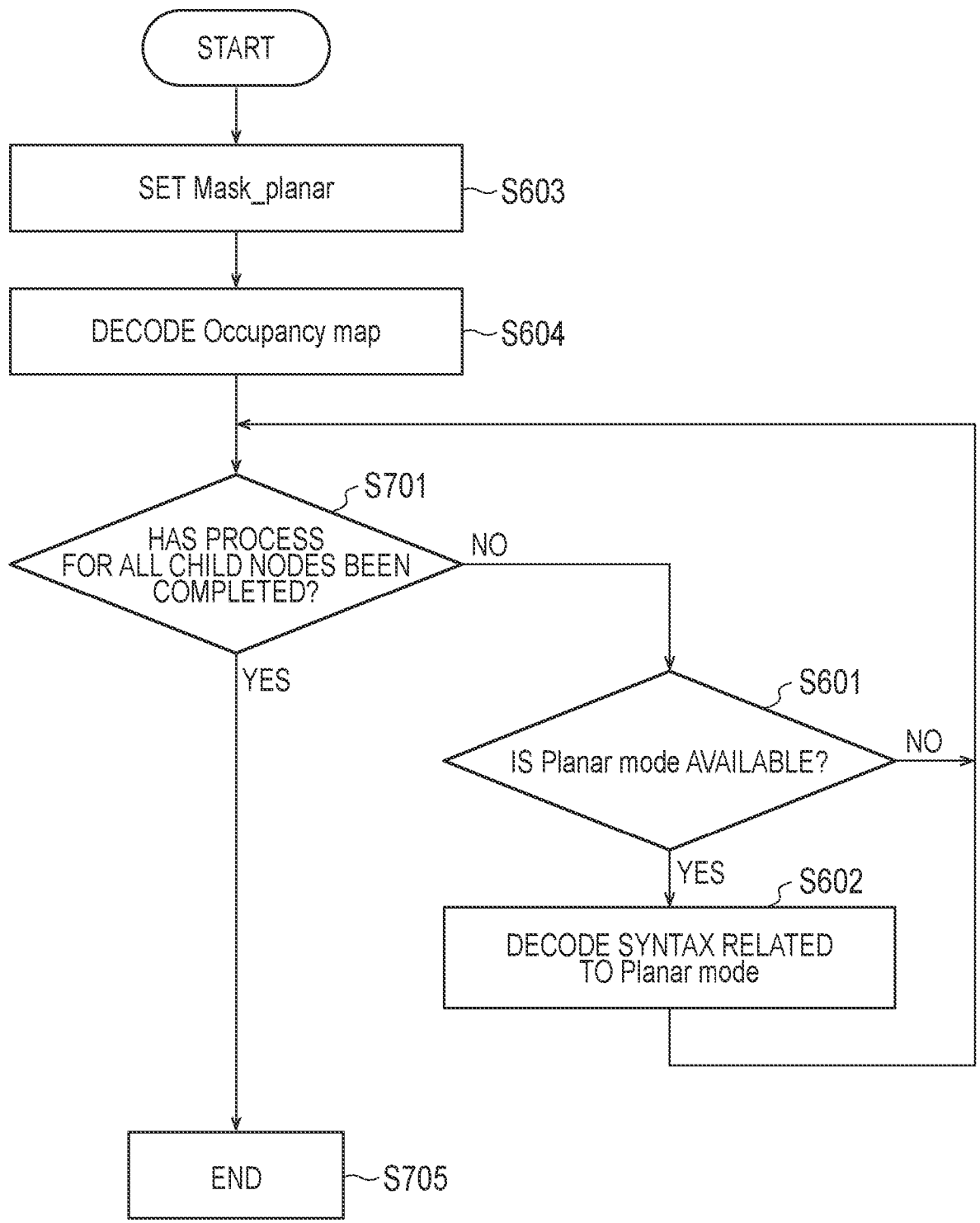
FIG. 7 is a flow chart illustrating an example of a node information decoding process in step S506 of FIG. 5.

Note that the above procedure can be changed in order as in FIG. 7. Specifically, the tree synthesizing unit 2020 can first carry out Mask_planar setting and Occupancy map decoding, and then can carry out determination of whether or not Planar mode is available and a process of decoding syntax related to Planar mode.

In this case, determination of whether or not Planar mode is available and a process of decoding syntax related to Planar mode are carried out not for the node but for each child node of the node. Therefore, with step S701 added, the tree synthesizing unit 2020 carries out looping until a process for all child nodes decoded as having the point-cloud data based on Occupancy map is completed.

(Attribute-Information Decoding Unit 2060)

Control data that the attribute-information decoding unit 2060 decodes will be described below with FIGS. 9 and 10.

Figure 9:
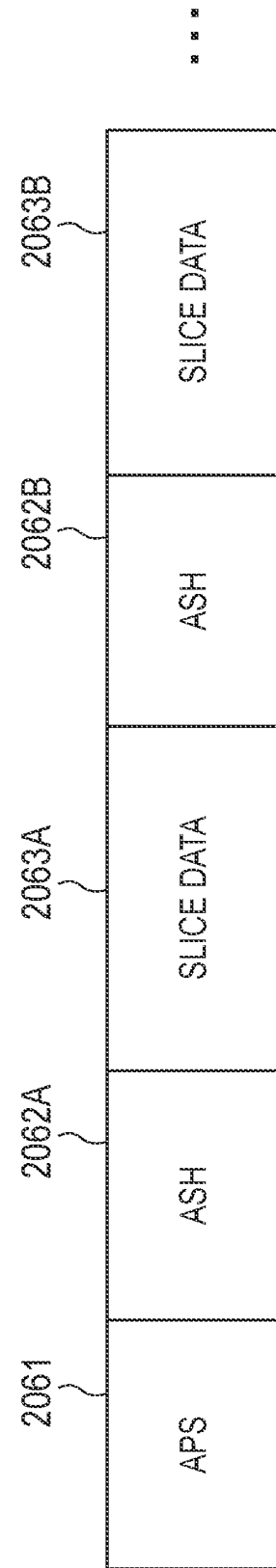
FIG. 9 is a configuration example of encoded data (bit stream) received by an attribute-information decoding unit 2060 of the point-cloud decoding device 200 according to the embodiment.

FIG. 9 is a configuration example of encoded data (bit stream) received by the attribute-information decoding unit 2060.

First, the bit stream may include APS 2061. The APS 2061 is also called an attribute parameter set and is an aggregate of control data regarding decoding of attribute information. A specific example will be described later. Each APS 2061 includes at least APS id information for individual identification in a case where plural pieces of APS 2061 are present.

Secondly, the beam stream may include ASH 2062A/2062B. The ASH 2062A/2062B are also called attribute slice headers and are aggregates of control data corresponding to later-described slices. A specific example will be described later. The ASH 2062A/2062B includes at least APS id information for specifying the APS 2061 corresponding to the ASH 2062A/2062B.

Thirdly, the bit stream may include slice data 2063A/2063B subsequent to the ASH 2062A/2062B. The slice data 2063A/2063B includes encoded data of attribute information.

As above, the bit stream is configured such that the ASH 2062A and the APS 2061 correspond to the slice data 2063A and the ASH 2062B and the APS 2061 correspond to the slice data 2063B.

As described above, since which APS 2061 is to be referenced is specified with the APS id information in the ASH 2062A/2062B, the common APS 2061 can be used for the plural pieces of slice data 2063A/2063B.

In other words, the APS 2061 is not necessarily required to be transmitted for each slice. For example, as in FIG. 9, the bit stream can be configured such that the APS 2061 is not encoded immediately before the ASH 2062B and the slice data 2063B.

Note that the configuration of FIG. 9 is just exemplary. As long as the ASH 2062A/2062B and the APS 2061 correspond to the slice data 2063A/2063B, an element other than those described above may be added as a constituent element of the bit stream. For example, the bit stream may include a sequence parameter set (SPS).

Similarly, for transmission, the bit stream may be brought into a configuration different from that of FIG. 9. Furthermore, the bit stream may be synthesized with the bit stream that the geometry information decoding unit 2010 decodes, for transmission of a single bit stream. For example, the pieces of slice data 2013A and 2063A may be treated as a single piece of slice data, and the pieces of slice data 2013B and 2063B may be treated as a single piece of slice data. The GSH 2012A and the ASH 2062A may be disposed immediately before the corresponding slice, and the GSH 2012B and the ASH 2062B may be disposed immediately before the corresponding slice. In such a case, the GPS 2011 and the APS 2061 may be disposed before all GSH and ASH.

FIG. 10 is an example of a syntax configuration of APS 2061.

The APS 2061 may include APS id information (aps_attr_parameter_set_id) for identifying the APS 2061.

The APS 2061 may include information (attr_coding_type) indicating a method of decoding the attribute information. For example, it may be defined that: when the value of attr_coding_type is "0", the inverse lifting unit 2100 carries out variable weighted lifting prediction; when the value of attr_coding_type is "1", the RAHT unit 2080 carries out RAHT; and when the value of attr_coding_type is "2", the inverse lifting unit 2100 carries out lifting prediction with a fixed weight.

The APS 2061 may include a flag (lifting_scalability_enabled_flag) indicating whether or not scalable lifting is to be applied when the value of attr_coding_type is "2", namely, in a case where the inverse lifting unit 2100 carries out the lifting prediction with the fixed weight.

It may be defined that, when the value of lifting_scalability_enabled_flag is "0", scalable lifting is not to be applied, and it may be defined that, when the value of lifting_scalability_enabled_flag is "1", scalable lifting is to be applied.

It may be defined that, when the value of lifting_scalability_enabled_flag is "1", namely, in a case where scalable lifting is to be applied, skipOctreeLayers is acquired as described above as an external parameter at the time of execution of the point-cloud decoding device 200.

It may be defined that, in a case where the above described "QtBt" is to be applied, namely, when the value of geom_tree_coded_axis_list_present_flag is "1", scalable lifting is not to be applied, namely, the value of lifting_scalability_enabled_flag is always "0".

That is, with the geometry information decoding unit 2010 that decodes a flag for control of whether or not "QtBt" is to be applied and the attribute-information decoding unit 2060 that decodes a flag for control of whether or not "scalable lifting" is to be applied, in a case where "QtBt" is applied, "scalable lifting" may be restricted not to be applied.

Such a restriction for exclusive application of "QtBt" and scalable lifting as above causes simple specifications with a reduction in functional combination, resulting in simplification of implementation.

For example, "Octree" is restricted always to be applied in a case where scalable lifting is applied. Thus, the node shape is always a cube in a process of scalable lifting, and the process can be carried out on an assumption that octree division is always carried out in each division. Therefore, the specifications can be simplified in comparison to a case where the node shape is a cuboid and quadtree division and binary tree division are allowed in addition to octree division as types of division.

The APS 2061 may include syntax (lifting_num_detail_levels_minus1) specifying the level number of LoD that the LoD calculation unit 2090 calculates. The value of LoD is required to be an integer value of 1 or more, and thus, for example, the syntax may have in advance an integer value of 0 or more, and the value resulting from addition of "1" to the value of the syntax may be set as the level number of LoD.

The APS 2061 may include a flag (lifting_morton_sort_skip_enabled_flag) for control of whether or not the LoD calculation unit 2090 carries out a process of sorting.

For example, it may be defined that a process of soring is carried out when the value of lifting_morton_sort_skip_enabled_flag is "0" and no process of sorting is carried out when the value of lifting_morton_sort_skip_enabled_flag is "1".

For example, it may be defined that, when the value of lifting_num_detail_levels_minus1 described above is "0", namely, only when the level number of LoD is "1", the APS 2061 includes lifting_morton_sort_skip_enabled_flag.

As a restriction, it may be defined that, when the value of gps_predictive_mode_enabled_flag is "0", namely, in a case where Predictive coding is not to be applied, the value of lifting_morton_sort_skip_enabled_flag is always "0".

That is, with the geometry information decoding unit 2010 that decodes a flag for control of whether or not Predictive coding is applicable and the attribute-information decoding unit 2060 that decodes a flog for control of whether or not a process of sorting is to be carried out based on the decoded position information of the point-cloud data, before decoding of the attribution information of the point-cloud data as the decoding target, a restriction may be provided such that, when the flag for control of whether or not Predictive coding is applicable indicates that Predictive coding is not applicable, the value of the flag for control of whether or not a process of sorting is to be carried out is always set as the value indicating "a process of sorting is to be carried out".

The function "no process of sorting is carried out" in decoding of the attribute information corresponds to a function of achieving a low delay process (for shortening the delay time from the time of input of point-cloud data as the coding target to the time of output of the corresponding point-cloud data to the bit stream) on the point-cloud encoding device 100 side. Combination of the function with Predictive coding for sequential decoding of the position information enables the function to be particularly effective.

Therefore, limiting the function "no process of sorting is carried out" only to Predictive coding in combination enables simplification of design and verification with the function retained in effectiveness.

(LoD Calculation Unit 2090)

An example of processing contents of the LoD calculation unit 2090 will be described below with FIG. 11.

FIG. 11 is an example of a flow chart of the LoD calculation unit 2090.

In step S1101, the LoD calculation unit 2090 carries out a process of rearranging (sorting) the position information of each point in the point cloud output from the geometry information reconfiguration unit 2040.

Specifically, for example, with, as input, the one-dimensional array data Order[i] storing, in ascending order, the index given to the position information of each piece of point-cloud data generated by the tree synthesizing unit 2020, the LoD calculation unit 2090 may update the one-dimensional array data Order[i], with a result of sorting based on the position information. For example, in the ascending order of Morton code generable from the position information, the LoD calculation unit 2090 may sort the position information.

In a case where the flag (lifting_morton_sort_skip_enabled_flag) for control of whether or not a process of sorting is to be carried out has the value indicating that a process of sorting is not to be carried out, for example, in the above described example, when the value of lifting_morton_sort_skip_enabled_flag is "1", the LoD calculation unit 2090 does not necessarily carry out the process of sorting.

It may be defined that, if the above described process of sorting is not carried out, the index of each point of the point-cloud data is given in the order of decoding of the tree synthesizing unit 2020. Furthermore, it may be defined that the index of each point of the point-cloud data is stored in the one-dimensional array data Order[i] in the ascending order of the index.

It may be defined that, in a case where the above described process of sorting is not carried out and Predictive coding is determined to be applied by the tree synthesizing unit 2020, the index of each point of the point-cloud data is given in the order of decoding of the tree synthesizing unit 2020 with Predictive coding. Furthermore, it may be defined that the index of each point of the point-cloud data is stored in the one-dimensional array data Order[i] in the ascending order of the index.

That is, the LoD calculation unit 2090 may be configured to determine whether or not a process of sorting is to be carried out based on the decoded position information of the point-cloud data, before decoding of the attribute information of the point-cloud data as the decoding target, and to decode, in a case where a process of sorting is not carried out, the attribute information based on the order of the indices stored in the one-dimensional array.

Due to such a configuration as above, even in a case where the above described process of sorting is not carried out, a procedure for the decoding process of the attribute information is uniquely determined, leading to unique association between the decoded position information and attribute information.

As above, after the above described process of sorting is carried out or omitted, the LoD calculation unit 2090 proceeds to the process in step S1102.

In step S1102, the LoD calculation unit 2090 calculates LoD regarding the position information of each point. As a specific method of calculating LoD, a known technique can be applied, and thus detailed description thereof will be omitted.

After calculating the LoD of each piece of point-cloud data, the LoD calculation unit 2090 proceeds to the process in step S1103.

In step S1103, regarding each node, the LoD calculation unit 2090 carries out k-nearest neighbor search with nodes belonging to LoD higher than the LoD of the node. As a specific method for the k-nearest neighbor search, a known technique can be applied, and thus detailed description thereof will be omitted.

After carrying out the k-nearest neighbor search regarding all the nodes, the LoD calculation unit 2090 proceeds to the process in step S1104, leading to termination.

Further, the point-cloud encoding device 100 and the point-cloud decoding device 200 may be realized as a program causing a computer to execute each function (each step).

Note that the above described embodiments have been described by taking application of the present invention to the point-cloud encoding device 10 and the point-cloud decoding device 30 as examples. However, the present invention is not limited only thereto, but can be similarly applied to an encoding/decoding system having functions of the encoding device 10 and the decoding device 30.

What is claimed is:

1. A point-cloud decoding device comprising:
    decoding circuitry configured to receive an encoded bitstream comprising occupancy-code syntax that represents geometry of a three-dimensional point cloud; and
    a tree synthesizing unit operatively coupled to the decoding circuitry, the tree synthesizing unit being configured to generate Mask_planar corresponding to eight child nodes of a node, wherein
    in a case where the node is subjected to quadtree division or binary tree division, the tree synthesizing unit is configured to set, as "0", a value of the Mask_planar corresponding to a child node belonging to a plane closer to an origin in an axial direction in which no division is made, and set, as "1", a value of the Mask_planar corresponding to a child node belonging to a plane further away from the origin in the axial direction in which no division is made.

2. The point-cloud decoding device according to claim 1, wherein
    the tree synthesizing unit is configured to:
        decode Occupancy map indicating whether or not point-cloud data is present in each child node of the node;
        set, regarding a child node of which a value of the Mask_planar is "1", as "0", a value of the Occupancy map corresponding to the child node; and
        set, regarding a child node of which a value of the Mask_planar is "0", a value of the Occupancy map with reference to a value of Occupancy code included in a bit stream.

3. A point-cloud decoding device comprising:
    decoding circuitry configured to parse an encoded bitstream comprising occupancy-code syntax; and
    a tree synthesizing unit configured to generate, for each axial direction of a node, a flag indicating whether or not Planar mode is applicable, wherein
    in a case where the node is subjected to quadtree division or binary tree division, the tree synthesizing unit is configured to set a value of the flag indicating whether or not the Planar mode is applicable, corresponding to an axial direction in which no division occurs, as a value indicating that the Planar mode is not applicable.

4. A point-cloud decoding method comprising:
    receiving, by decoding circuitry, an encoded bitstream comprising occupancy-code syntax that describes geometry information of a point cloud;
    generating Mask_planar corresponding to eight child nodes of a node, wherein
    in a case where the node is subjected to quadtree division or binary tree division, the generating incudes: setting, as "0", a value of the Mask_planar corresponding to a child node belonging to a plane closer to an origin in an axial direction in which no division is made; and setting, as "1", a value of the Mask_planar corresponding to a child node belonging to a plane further away from the origin in the axial direction in which no division is made.

5. A point-cloud decoding method comprising:
receiving, by decoding circuitry, an encoded bitstream comprising occupancy-code syntax; and
generating, for each axial direction of a node, a flag indicating whether or not Planar mode is applicable, in which
in a case where the node is subjected to quadtree division or binary tree division, the generating includes setting a value of the flag indicating whether or not the Planar mode is applicable, corresponding to an axial direction in which no division occurs, as a value indicating that the Planar mode is not applicable.

6. A computer program product comprising a non-transitory computer readable medium encoded with an information processing program for use in an information processing device, the program when executed performs operations comprising:
receiving an encoded bitstream comprising occupancy-code syntax; and
generating Mask_planar corresponding to eight child nodes of a node, wherein
in a case where the node is subjected to quadtree division or binary tree division, the generating incudes: setting, as "0", a value of the Mask_planar corresponding to a child node belonging to a plane closer to an origin in an axial direction in which no division is made; and
setting, as "1", a value of the Mask_planar corresponding to a child node belonging to a plane further away from the origin in the axial direction in which no division is made.

7. A computer program product comprising a non-transitory computer readable medium encoded with an information processing program for use in an information processing device, the program when executed performs operations comprising:
receiving an encoded bitstream comprising occupancy-code syntax; and
generating, for each axial direction of a node, a flag indicating whether or not Planar mode is applicable, in which
in a case where the node is subjected to quadtree division or binary tree division, the generating includes setting a value of the flag indicating whether or not the Planar mode is applicable, corresponding to an axial direction in which no division occurs, as a value indicating that the Planar mode is not applicable.

* * * * *